(12) United States Patent
Jan Snijders et al.

(10) Patent No.: US 8,343,583 B2
(45) Date of Patent: Jan. 1, 2013

(54) METHOD FOR VAPORIZING NON-GASEOUS PRECURSOR IN A FLUIDIZED BED

(75) Inventors: Gert Jan Snijders, Amersfoort (NL); Ivo Raaijmakers, Bilthoven (NL)

(73) Assignee: ASM International N.V. (NL)

( * ) Notice: Subject to any disclaimer, the term of this patent is extended or adjusted under 35 U.S.C. 154(b) by 457 days.

(21) Appl. No.: 12/498,885

(22) Filed: Jul. 7, 2009

(65) Prior Publication Data
US 2010/0009080 A1 Jan. 14, 2010

Related U.S. Application Data

(60) Provisional application No. 61/079,584, filed on Jul. 10, 2008.

(51) Int. Cl.
*C23C 16/442* (2006.01)
(52) U.S. Cl. ............... 427/252; 427/255.23; 427/255.28
(58) Field of Classification Search ............... 427/248.1, 427/255.23, 255.28, 252
See application file for complete search history.

(56) References Cited

U.S. PATENT DOCUMENTS

| | | | |
|---|---|---|---|
| 87,192 A | 2/1869 | Paine | |
| 113,147 A | 3/1871 | Dupas et al. | |
| 160,410 A | 3/1875 | Ferguson | |
| 230,656 A | 8/1880 | Radkey | |
| 1,103,789 A | 7/1914 | Macey | |
| 1,525,786 A | 2/1925 | Waldo | |
| 1,860,111 A | 5/1932 | Miller | |
| 2,206,688 A | 7/1940 | Bloomheart | |
| 2,333,898 A | 11/1943 | Stevenson et al. | |
| 2,447,789 A | 8/1948 | Barr | |
| 2,738,762 A | 3/1956 | Pawlyk | |
| 3,569,672 A | 3/1971 | Hurko | |
| 3,849,077 A * | 11/1974 | Becuwe | 23/294 R |
| 3,912,795 A | 10/1975 | Jackson | |
| 3,957,467 A | 5/1976 | Kim | |
| 3,989,477 A | 11/1976 | Wilson et al. | |
| 4,060,647 A * | 11/1977 | Pan et al. | 427/460 |
| 4,221,182 A * | 9/1980 | Brown | 118/716 |

(Continued)

FOREIGN PATENT DOCUMENTS

DE 33 39 625 5/1985

(Continued)

OTHER PUBLICATIONS

Polezhaev, Yu. V., et al., "Convective Heat Transfer in Combustors with a Circulating Fluidized Bed". High Temperature, vol. 40, No. 2, 2002, pp. 286-294.*

(Continued)

*Primary Examiner* — Bret Chen
(74) *Attorney, Agent, or Firm* — Knobbe Martens Olson & Bear LLP (57) ABSTRACT

Methods and systems for depositing a film on a substrate are disclosed. In one embodiment, a method includes converting a non-gaseous precursor into vapor phase. Converting the precursor includes: forming a fluidized bed by flowing gas at a sufficiently high flow rate to suspend and stir a plurality of solid particles, and converting the phase of the non-gaseous precursor into vapor phase in the fluidized bed. The method also includes transferring the precursor in vapor phase through a passage; and performing deposition on one or more substrates with the transferred precursor in vapor phase.

12 Claims, 8 Drawing Sheets

U.S. PATENT DOCUMENTS

| | | | |
|---|---|---|---|
| 4,268,279 A | | 5/1981 | Shindo et al. |
| 4,297,971 A | * | 11/1981 | Henery ............ 118/719 |
| 4,314,128 A | | 2/1982 | Chitre |
| 4,351,861 A | * | 9/1982 | Henery ............ 427/255.25 |
| 4,389,973 A | | 6/1983 | Suntola et al. |
| 4,393,013 A | | 7/1983 | McMenamin |
| 4,436,674 A | | 3/1984 | McMenamin |
| 4,474,230 A | * | 10/1984 | McCallister ............ 165/104.21 |
| 4,548,138 A | | 10/1985 | Korenberg |
| 4,585,673 A | * | 4/1986 | Sigai ............ 427/213 |
| 4,610,859 A | | 9/1986 | Miyagawa et al. |
| 4,683,541 A | * | 7/1987 | David ............ 700/274 |
| 4,684,542 A | | 8/1987 | Jasinski et al. |
| 4,747,367 A | | 5/1988 | Posa |
| 4,761,269 A | | 8/1988 | Conger et al. |
| 4,774,032 A | | 9/1988 | Coates et al. |
| 4,783,343 A | | 11/1988 | Sato |
| 4,828,224 A | | 5/1989 | Crabb et al. |
| 4,834,020 A | | 5/1989 | Bartholomew |
| 4,844,949 A | * | 7/1989 | Arai et al. ............ 427/213 |
| 4,849,259 A | | 7/1989 | Biro et al. |
| 4,883,362 A | | 11/1989 | Gartner et al. |
| 4,891,103 A | | 1/1990 | Zorinsky et al. |
| 4,904,419 A | | 2/1990 | Reynolds |
| 4,911,101 A | | 3/1990 | Ballingall et al. |
| 4,947,790 A | | 8/1990 | Gartner et al. |
| 5,053,132 A | | 10/1991 | Sirkar |
| 5,084,089 A | | 1/1992 | Zekely et al. |
| 5,143,526 A | | 9/1992 | Lee et al. |
| 5,171,734 A | * | 12/1992 | Sanjurjo et al. ............ 505/447 |
| 5,204,314 A | | 4/1993 | Kirlin et al. |
| 5,221,556 A | | 6/1993 | Hawkins et al. |
| 5,227,329 A | | 7/1993 | Kobayashi et al. |
| 5,272,880 A | | 12/1993 | Nishizato et al. |
| 5,385,689 A | | 1/1995 | Tom et al. |
| 5,389,570 A | | 2/1995 | Shiozawa |
| 5,409,822 A | * | 4/1995 | Scott et al. ............ 435/139 |
| 5,536,323 A | | 7/1996 | Kirlin et al. |
| 5,543,043 A | | 8/1996 | Bates et al. |
| 5,545,292 A | * | 8/1996 | Empie ............ 162/30.11 |
| 5,551,278 A | | 9/1996 | Rounbehler et al. |
| 5,553,395 A | | 9/1996 | Wen et al. |
| 5,620,743 A | * | 4/1997 | Harth et al. ............ 427/213 |
| 5,674,574 A | | 10/1997 | Atwell et al. |
| 5,698,037 A | | 12/1997 | Stauffer |
| 5,711,816 A | | 1/1998 | Kirlin et al. |
| 5,719,417 A | | 2/1998 | Roeder et al. |
| 5,786,027 A | | 7/1998 | Rolfson |
| 5,822,991 A | * | 10/1998 | Pierzchala et al. ............ 60/653 |
| 5,862,605 A | | 1/1999 | Horie et al. |
| 5,876,503 A | | 3/1999 | Roeder et al. |
| 5,904,771 A | | 5/1999 | Tasaki et al. |
| 5,989,305 A | | 11/1999 | Ohsaki et al. |
| 6,015,590 A | | 1/2000 | Suntola et al. |
| 6,033,493 A | | 3/2000 | Hertz et al. |
| 6,039,894 A | | 3/2000 | Sanjurjo et al. |
| 6,082,714 A | | 7/2000 | Dornfest et al. |
| 6,093,252 A | | 7/2000 | Wengert et al. |
| 6,096,134 A | | 8/2000 | Zhao et al. |
| 6,120,640 A | | 9/2000 | Shih et al. |
| 6,132,492 A | | 10/2000 | Hultquist et al. |
| 6,178,925 B1 | | 1/2001 | Sturm et al. |
| 6,220,091 B1 | | 4/2001 | Chen et al. |
| 6,231,641 B1 | | 5/2001 | Utigard et al. |
| 6,244,331 B1 | | 6/2001 | Budelman |
| 6,244,575 B1 | | 6/2001 | Vaartstra et al. |
| 6,251,233 B1 | | 6/2001 | Plester et al. |
| 6,258,170 B1 | | 7/2001 | Somekh et al. |
| 6,270,839 B1 | | 8/2001 | Onoe et al. |
| 6,273,951 B1 | | 8/2001 | Vaartstra |
| 6,325,017 B1 | | 12/2001 | DeBoer et al. |
| 6,409,839 B1 | | 6/2002 | Sun et al. |
| 6,470,833 B1 | * | 10/2002 | Hyppanen ............ 122/4 D |
| 6,582,496 B1 | | 6/2003 | Cheng et al. |
| 6,586,046 B1 | * | 7/2003 | Ackerman et al. ............ 427/213 |
| 6,589,868 B2 | | 7/2003 | Rossman |
| 6,640,840 B1 | | 11/2003 | Mac Neil |
| 6,699,524 B2 | | 3/2004 | Kesälä |
| 6,718,126 B2 | | 4/2004 | Lei |
| 6,720,259 B2 | | 4/2004 | Londergan et al. |
| 6,783,590 B2 | | 8/2004 | Lindfors et al. |
| 6,905,541 B2 | | 6/2005 | Chen et al. |
| 6,906,296 B2 | | 6/2005 | Centanni et al. |
| 6,921,062 B2 | | 7/2005 | Gregg et al. |
| 7,108,747 B1 | | 9/2006 | Leskelä et al. |
| 7,122,085 B2 | | 10/2006 | Shero et al. |
| 7,156,380 B2 | | 1/2007 | Soininen |
| 7,186,385 B2 | | 3/2007 | Ganguli et al. |
| 7,253,084 B2 | | 8/2007 | Todd et al. |
| 7,270,709 B2 | | 9/2007 | Chen et al. |
| 7,497,420 B2 | | 3/2009 | Soininen |
| 7,601,225 B2 | | 10/2009 | Tuominen et al. |
| 7,851,019 B2 | | 12/2010 | Tuominen et al. |
| 2001/0042523 A1 | | 11/2001 | Kesala |
| 2002/0168868 A1 | | 11/2002 | Todd |
| 2002/0197831 A1 | | 12/2002 | Todd et al. |
| 2003/0012873 A1 | * | 1/2003 | Hirono et al. ............ 427/185 |
| 2003/0053799 A1 | | 3/2003 | Lei |
| 2003/0082300 A1 | | 5/2003 | Todd et al. |
| 2003/0162848 A1 | * | 8/2003 | Gimpel et al. ............ 518/716 |
| 2003/0175650 A1 | | 9/2003 | Ridder et al. |
| 2004/0016404 A1 | | 1/2004 | Gregg et al. |
| 2004/0173336 A1 | * | 9/2004 | Graham ............ 164/122.1 |
| 2005/0000428 A1 | | 1/2005 | Shero et al. |
| 2005/0039794 A1 | | 2/2005 | Birtcher et al. |
| 2005/0079692 A1 | | 4/2005 | Samoilov et al. |
| 2005/0209351 A1 | * | 9/2005 | Mohedas et al. ............ 518/726 |
| 2006/0110930 A1 | | 5/2006 | Senzaki |
| 2006/0216419 A1 | | 9/2006 | Shero et al. |
| 2007/0053807 A1 | * | 3/2007 | Boer et al. ............ 422/198 |
| 2011/0076402 A1 | | 3/2011 | Tuominen et al. |

FOREIGN PATENT DOCUMENTS

| | | |
|---|---|---|
| GB | 2 151 662 | 7/1985 |
| JP | 1265511 | 10/1989 |
| JP | 08-299778 | 11/1996 |
| JP | 011 168092 | 6/1999 |
| JP | 2002-359238 | 12/2002 |
| WO | WO 02/064853 | 8/2002 |
| WO | WO 2004/011695 | 2/2004 |
| WO | WO 2007/057631 | 5/2007 |

OTHER PUBLICATIONS

Fan, Liang-Tseng, et al., "Mechanics of Semifluidization of Single Size Particles in Solid-Liquid Systems". A.I.Ch.E. Journal, Dec. 1961, pp. 606-610.*

Wilhelm, Richard H., et al., "The Fluidized Bed".Industrial and Engineering Chemistry, vol. 43, No. 5, pp. 1199-1203.*

Aiche, Lynda, et al., "Surface Modification of Polymer Powders by a Far Cold Remote Nitrogen Plasma in Fluidized Bed". Interface Controlled Organic Thin Films, by H.-G. Robahn et al.; 2009, pp. 79-83.*

Leroy, J.B, et al., "Treatment of a Polyethylene Powder Using a Remote Nitrogen Plasma Reactor Coupled With a Fluidized Bed: Influence on Wettability and Flowability". Plasmas and Polymers, vol. 8, No. 1, Mar. 2003, 2003, pp. 13-29.*

Burykina, et al., "Plasma ond diffueion coatings on graphite," Powder Metallurgy and Metal Ceramics. vol, 4 No. 12: p. 991-995 (1995).

Callister, William, Materials Science and Engineering an Introduction, Fourth Edition. Wiley and Sons, p. 791 (1997).

Leskela et al., :ALS Precursor chemistry: Evolution and future challenges, *Journal de Physique*IV France 9, 837-852 (1999).

Random House Webster's Unabridged Dictionary $2^{nd}$ Edition, Random House, 2001, pp. 887 and 888.

Smith, J.M., Chemical Engineering Kinetics, $3^{rd}$ Edition, McGraw-Hill Book Company, p. 554-563 (1981).

Smith, J.M., Chemical Engineering Kinetics, $3^{rd}$ Edition, McGraw-Hill Book Company, p. 268-291 (1981).

Suntola, "Atomic layer epitaxy," *Thin Solid Films*, 216: 84-89 (1992).

Webster's New World Dictionary, $2^{nd}$ College Ed., The World Publishing Co., 1972, p. 650.

* cited by examiner

METHOD FOR VAPORIZING NON-GASEOUS PRECURSOR IN A FLUIDIZED BED

CROSS-REFERENCE TO RELATED APPLICATIONS

This application is a non-provisional of U.S. Provisional Patent Application No. 61/079,584, filed Jul. 10, 2008, which is incorporated herein by reference.

FIELD OF THE INVENTION

The present invention relates generally to semiconductor processing equipment and, more particularly, to apparatus for providing vapor-phase precursor from solid or liquid sources for semiconductor processing.

BACKGROUND OF THE INVENTION

In the fabrication of integrated circuits on substrates, such as semiconductor wafers, the vapor deposition of chemicals, such as chemical vapor deposition ("CVD") and atomic layer deposition (ALD), is often desirable. The expansion of suitable source chemicals has increasingly led to use of precursor materials that are naturally liquid or solid at room temperature and atmospheric pressure.

In order to effectively deposit using precursors from a solid or liquid source material, the solid or liquid source material must be vaporized first. In pursuit of this goal, evaporation apparatuses are used to effectuate the vaporization of a solid or liquid source material. In addition, heat sources are often employed in conjunction with such an apparatus in order to increase the vapor pressure above the solid or liquid source material.

Unfortunately, existing semiconductor processing systems, of which an evaporation apparatus is a component, have a number of shortcomings. For example, an evaporation apparatus for subliming a solid source material or vaporizing a liquid source material may offer both an inadequate ratio of solid or liquid source surface area to the desired vapor volume, and poor carrier gas/source material contact time. Often, current processing systems can allow a carrier gas to flow from inlet to outlet without intimately contacting the source material, thus preventing the carrier gas from becoming saturated with precursor vapor.

In certain instances, a large amount of precursor vapor is needed for deposition, such as batch-type deposition. In addition, deposition on a substrate having three-dimensional topology needs a large amount of precursor for a short period of time. Thus, there is a need for an evaporation apparatus that efficiently converts a solid or liquid source material into gas phase.

SUMMARY OF THE INVENTION

According to one embodiment, a method of depositing a film on a substrate includes converting a non-gaseous precursor into vapor phase. Converting the precursor includes forming a fluidized bed by flowing gas at a sufficiently high flow rate to suspend and stir a plurality of solid particles, and vaporizing the non-gaseous precursor in the fluidized bed. The method of depositing also includes transferring the precursor in vapor phase through a passage, and performing deposition on one or more substrates with the transferred precursor in vapor phase.

According to another embodiment, a deposition system includes: a vapor deposition reactor; a first passage; and a fluidized bed evaporator in fluid communication with the reactor via the first passage.

According to yet another embodiment, an apparatus for providing a vapor phase precursor for deposition is provided. The apparatus includes a fluidized bed evaporator, which includes a vessel body and a distributor plate positioned inside the vessel body. The distributor plate includes a plurality of holes formed therethrough. The fluidized bed evaporator further includes a precursor outlet formed through the vessel body above the distributor plate and a carrier gas inlet formed through the vessel body below the distributor plate. The carrier gas inlet is in fluid communication with the precursor outlet through the distributor plate. The apparatus further includes a fluidized bed condenser in fluid communication with the fluidized bed evaporator. The fluidized bed condenser includes a condenser vessel and a condenser distributor plate inside the condenser vessel. The condenser distributor plate includes a plurality of openings.

According to yet another embodiment, an apparatus for providing a vapor phase precursor for deposition is provided. The apparatus includes a fluidized bed evaporator which includes a vessel body and a distributor plate positioned inside the vessel body. The distributor plate includes a plurality of holes formed therethrough. The fluidized bed evaporator also includes a precursor gas outlet formed through the vessel body above the distributor plate, and a carrier gas inlet formed through the vessel body below the distributor plate. The carrier gas inlet is configured to flow a carrier gas through the distributor plate to the precursor gas outlet. The apparatus further includes a heated pipe in fluid communication with the precursor gas outlet.

BRIEF DESCRIPTION OF THE DRAWINGS

The invention will be better understood from the detailed description of the preferred embodiments and from the appended drawings, which are meant to illustrate and not to limit the invention and wherein like numerals refer to like parts throughout.

DETAILED DESCRIPTION OF THE PREFERRED EMBODIMENTS

In one embodiment, a deposition system includes a reactor, a gas passage, and a fluidized bed evaporator. The fluidized bed evaporator is in fluid communication with the reactor via the gas passage. The fluidized bed evaporator may vaporize one or more non-gaseous (liquid or solid) precursor using a fluidized bed formed by solid particles. The solid particles, levitated and stirred by a high carrier gas flow, create a heated high surface contact area for precursor, and the fluidized bed provides an almost liquid-like medium that very efficiently transfers heat from a heat source to the particles. In one embodiment, the solid particles are inert solid granules, and the precursor either coats the granules or is mixed, in solid or liquid form, with the granules in the fluidized bed during operation. In another embodiment, the solid particles are solid precursor particles (e.g., powder) in the fluidized bed in the fluidized bed evaporator, and at least portion of the solid precursor particles may be vaporized by the fluidized bed evaporator.

Figure 1:
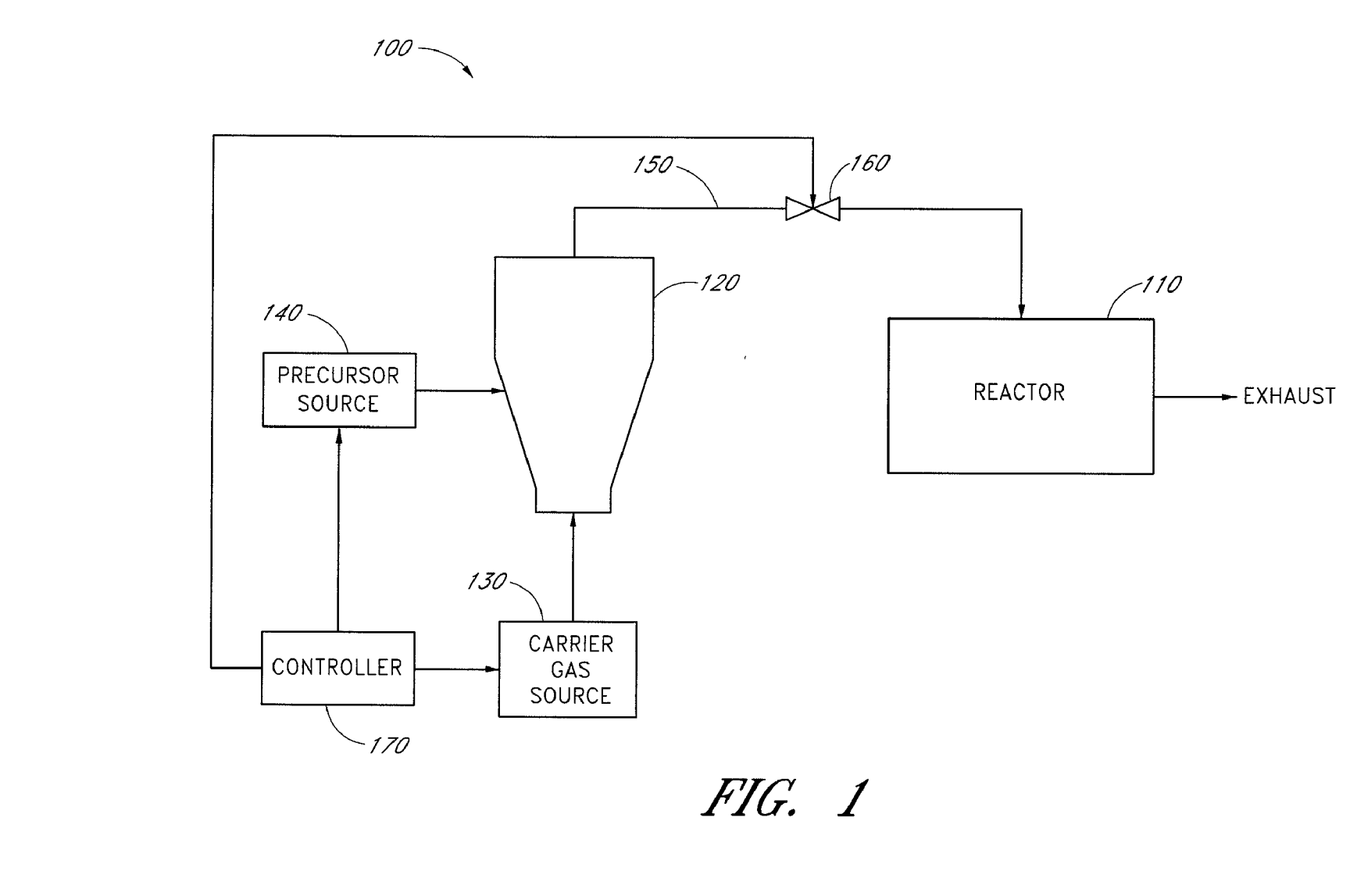
FIG. 1 is a block diagram of one embodiment of a deposition system including a fluidized bed evaporator.

Referring to FIG. 1, one embodiment of a deposition system 100 using a fluidized bed evaporator will be described below. The illustrated deposition system 100 includes a vapor deposition reactor 110, a fluidized bed evaporator 120, a carrier gas source 130, a precursor container 140, a gas line 150, and a valve 160. The system 100 also includes a controller 170 for controlling the operation of the system 100, and various other components for the operation of the system 100.

The reactor 110 defines a reaction space in which one or more substrates are processed. The reactor 110 can be a batch-type reactor that can process multiple substrates simultaneously, or a single-wafer reactor. The reactor 110 may operate continuously, and precursor supply for the fluidized bed evaporator 120 can be refreshed or recharged on the fly or between deposition runs. In some embodiments, the reactor 110 may be a chemical vapor deposition (CVD) reactor or an atomic layer deposition (ALD) reactor. In certain embodiments, the reactor 110 may also be configured to provide in-situ or remote plasma. A skilled artisan will appreciate that various types of reactors can be adapted for use as the reactor 110 for use in combination with fluidized bed evaporators, as described herein.

The fluidized bed evaporator 120 serves to change a non-gaseous precursor into vapor phase. The non-gaseous precursor may be either liquid or solid. The fluidized bed evaporator 120 may contain a fluidized bed formed by solid granules or particles. The solid granules or particles can be in a form of at least one of powder, bead, cylinder, rod, filament, fiber, ring, etc.

The term "fluidized bed" refers to a bed of solid particles, such as precursor particles or inert granules, with a flow of gas passing upward through the granules at a rate that is great enough to set the granules in motion. Gravity balances with the viscous forces in the flow to form a fluid-like state where intermixing between the granules and the gas is intense. An expanded bed may be formed when the gas flow rate increases and granules move apart. A few of the granules may visibly vibrate and move about in restricted regions. At higher velocities of gas flow, all the granules may be suspended. A skilled artisan will appreciate that the gas flow rate can vary widely, depending on the shape, size, and density of the solid particles, the design of the fluidized bed, gas viscosity, and so on. Solid particles in a fluidized bed can have properties and characteristics of normal fluids, such as the ability to free-flow under gravity, or to be pumped using fluid type technologies. A skilled artisan will also appreciate that the controller 170 can control various conditions (e.g., the gas flow rate, the amount of solid particles, and the like) for generating a desired fluidized bed.

The solid particles may have any suitable shape, weight, and size as long as they can form a fluidized bed. In one embodiment, inert granules are provided and have an average size of about 10 nm to about 10 mm, and optionally about 100 nm to about 0.1 mm. In one embodiment, a suitable carrier gas flow rate for forming a fluidized bed with the solid particles of the above average size may be between about 100 sccm and about 100 slm, and optionally between about 100 sccm to about 10 slm. For a given amount of precursor particles, the smaller the solid granules forming a fluidized bed are, the larger is the overall evaporation surface area provided by the fluidized bed. Table 1 shows the relationship between the average size of the granules and the evaporation surface area.

TABLE 1

|  | Particle average size (μm) | | |
| --- | --- | --- | --- |
|  | 50 | 20 | 10 |
| surface area/evaporation volume (m$^2$/cc) | 0.1 | 0.3 | 0.6 |

However, smaller particles may have a higher chance of escaping from the fluidized bed evaporator together with the vapor phase precursor, entailing more complex filtering needs. A skilled artisan will appreciate that the size of the particles can vary widely depending on the design of the fluidized bed evaporator.

In one embodiment where the non-gaseous precursor is liquid, the solid particles for forming the fluidized bed may be inert solid granules. The inert granules can be formed of a material that is thermally conductive and chemically inert to the precursor and carrier gas under the conditions during evaporation of the precursor. Examples of materials for the inert granules include, but are not limited to, alumina ($Al_2O_3$), fused silica, stainless steel, Hastelloy™, nickel, boron nitride (BN), and silicon carbide (SiC).

In another embodiment where the non-gaseous precursor is solid, the inert granules described above can form a fluidized bed for evaporating such a solid precursor. The solid precursor can coat the inert granules or the solid precursor can be a powder mixed and stirred with the inert granules. In yet another embodiment, the solid precursor itself may form a fluidized bed in the absence of inert granules. In such an embodiment, the solid precursor can have a form (for example, powder) suitable for forming a fluidized bed. A skilled artisan will appreciate that various forms of materials can form a fluidized bed. In the embodiments described above, a mixture of two or more precursor materials (liquid or solid) may be fed to the fluidized bed evaporator for evaporation. The two or more precursor materials in their gaseous state may be chosen to have substantially equal vapor pressures at a given temperature.

The carrier gas source 130 provides a high volumetric flow of an inert gas to the fluidized bed evaporator 120. Examples of the inert gas include, but are not limited to, argon gas (Ar), nitrogen gas ($N_2$), helium gas (He), and a combination of two or more of the foregoing. In certain embodiments, oxygen gas ($O_2$) can be used as long as it does not react with the precursor at the temperature and pressure in the fluidized bed. The inert gas supplied from the carrier gas source 130 may have a pressure that is sufficient to form a fluidized bed in the fluidized bed evaporator 120. A skilled artisan will appreciate that the controller 170 can control the carrier gas flow rate, pressure, and any other parameters for generating a fluidized bed in the evaporator 120.

The precursor container 140 serves to provide a precursor to the fluidized bed evaporator 120. The precursor may be liquid and/or solid as described above. In one embodiment, the precursor container 140 may provide the fluidized bed evaporator 120 with a solid precursor in a form of powder. In another embodiment, the precursor container 140 may supply inert granules coated with a solid precursor. A skilled artisan will appreciate that the precursor container 140 can provide any suitable form of precursor, depending on the design of the fluidized bed evaporator 120. In one embodiment, a solid precursor may be provided to the fluidized bed evaporator 120 between operations or deposition "runs." In another embodiment, a liquid precursor may be provided to the fluidized bed evaporator 120 between operations or during operation of the device. A skilled artisan will also appreciate that the controller 170 can control the supply of the precursor and/or inert granules, and any other parameters for generating a fluidized bed in the evaporator 120.

The gas line 150 serves as a passage for the vaporized precursor. The gas line 150 is in fluid communication with the reactor 110 and the fluidized bed evaporator 120. The gas line 150 may include filters to keep the solid or liquid precursor from being supplied to the reactor 110. In one embodiment, the gas line 150 may be heated to prevent condensation of the precursor on the gas line 150. A skilled artisan will appreciate that various configurations of heaters can be used to prevent the condensation of the precursor on the gas line 150. A skilled artisan will also appreciate that the controller 170 can be configured to control the temperature of the gas line 150.

The valve 160 or other types of meter serves to control the flow of the precursor into the reactor 110. The valve 160 may also shut off the flow of the precursor into the reactor 110. A skilled artisan will appreciate that various types of valves can be adapted for the valve 160. A skilled artisan will also appreciate that the controller 170 can be configured to control the operation of the valve 160.

The controller 170 serves to control the operation of the system 100. The controller 170 may control the operation of one or more of the vapor deposition reactor 110, the fluidized bed evaporator 120, the carrier gas source 130, the precursor container 140, the gas line 150, and the valve 160, and may be in communication with the foregoing components. The controller 170 may include a processor, a memory, a storage device, and a user interface. A skilled artisan will appreciate that the controller 170 can include any other components necessary for controlling the operation of the system 100.

In an embodiment, the fluidized bed evaporator 120 may provide a vapor phase precursor in a substantially continuous manner. In such an embodiment, the fluidized bed evaporator 120 may receive a liquid precursor substantially continuously or periodically, and supply a vapor phase precursor in a continuous manner to the reactor 110. In other words, the evaporator 120 can be supplied with fresh precursor without stopping evaporation.

Figure 2A:
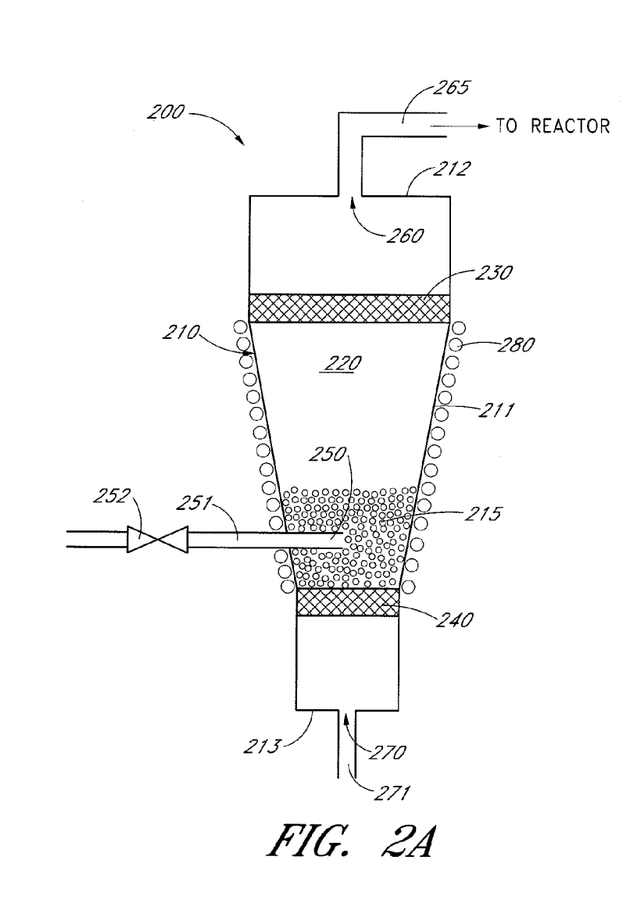
FIG. 2A is a cross-section of one embodiment of a fluidized bed evaporator before operation.
Figure 2B:
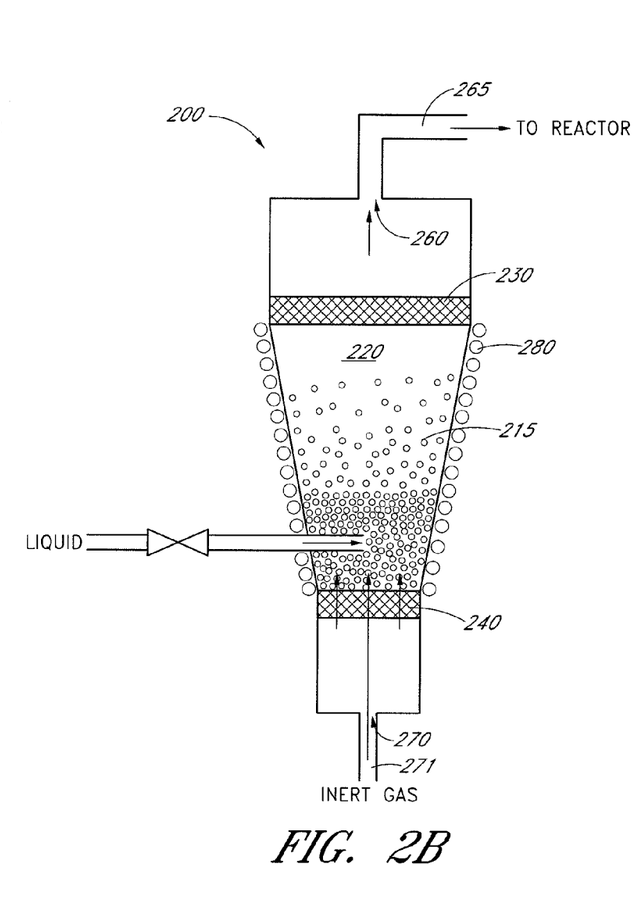
FIG. 2B is a cross-section of the fluidized bed evaporator of FIG. 2A during operation.

Referring to FIGS. 2A and 2B, one embodiment of a fluidized bed evaporator for a liquid precursor will be described below. Examples of liquid precursors include, but are not limited to, alkylaluminum compounds such as trimethyl aluminum ($(CH_3)_3Al$), also known as TMA, metal halides such as titanium tetrachloride ($TiCl_4$), boron compounds such as triethyl boron ($(CH_3CH_2)_3B$), also known as TEB, silicon compounds such as trisilane ($Si_3H_8$), alcohols such as ethanol, and water ($H_2O$). The illustrated fluidized bed evaporator 200 includes a vessel body 210, an evaporation space 220, a filter 230, a distributor plate 240, a precursor inlet 250, a precursor gas outlet 260, a carrier gas inlet 270, and a heater 280. A portion of the inner wall of the vessel body 210, the filter 230, and the distributor plate 240 together define the evaporation space 220.

The vessel body 210 contains inert granules 215 for forming a fluidized bed in the evaporation space 220 thereof. The details of the inert granules 215 can be as described above with respect to the inert granules in reference to FIG. 1. The illustrated vessel body 210 includes a sidewall 211, a top plate 212, and a bottom plate 213. The sidewall 211 surrounds the evaporation space 220. The illustrated vessel body 210 has a vertically conical shape with the area of the bottom plate 213 being narrower than the area of the top plate 212. A lower portion of the vessel body 210 between the distributor plate 240 and the bottom plate 213 may have a cylindrical shape. An upper portion of the vessel body 210 between the filter 230 and the top plate 212 may have a cylindrical shape. A skilled artisan will appreciate that the vessel body 210 can have various other shapes.

The filter 230 serves to prevent the inert granules 215 or precursor in liquid form from escaping from the vessel body 210 to the precursor outlet 260. The filter 230 includes openings that are smaller in size than the inert granules 215. In other embodiments, the filter 230 may be omitted, and a filter may be positioned outside the fluidized bed evaporator 200, for example, at a passage leading to a reactor.

The distributor plate 240 serves to support the inert granules 215 and allow a carrier gas to flow therethrough into the evaporation space 220 in an upward direction. The distributor plate 240 includes holes that are smaller in size than the inert granules 215 to prevent the inert granules 215 from passing therethrough. The holes are distributed and configured to allow the carrier gas to flow therethrough such that at least some of the inert granules 215 are suspended in the evaporation space 220 to form a fluidized bed. In certain embodiments, the distributor plate 240 may represent a porous frit.

The precursor inlet 250 serves as an inlet for a liquid precursor into the evaporation space 220. In the illustrated embodiment, the precursor inlet 250 is formed through the sidewall of the vessel body 210, and is in fluid communication with a precursor container (not shown) via a precursor inlet line 251. A valve 252 or other flow control device is on the precursor inlet line 251. In other embodiments, the precursor inlet may be at any suitable location.

The precursor gas outlet 260 serves as an outlet for an evaporated precursor. In the illustrated embodiment, the precursor gas outlet 260 is formed through the top plate 212 of the vessel body 210, and is in fluid communication with a reactor (not shown) via a gas line 265. In other embodiments, the precursor gas outlet may be at any suitable location. In certain embodiments, the precursor gas outlet 260 may be provided with a monitoring device to measure and/or control the concentration of a vapor phase precursor. The monitoring device may be, e.g., an infrared device.

The carrier gas inlet 270 serves as an inlet for the carrier gas supplied into the evaporation space 220. In the illustrated embodiment, the carrier gas inlet 270 is formed through the bottom plate and is in fluid communication with a carrier gas source (not shown) via a carrier gas line 271. In other embodiments, the carrier gas inlet may be at any suitable location. The carrier gas source provides a pressurized inert gas into the vessel body 210 through the carrier gas inlet 270. In certain embodiments, the carrier gas inlet 270 may be consolidated with the precursor inlet 250.

The heater 280 serves to heat the evaporation space 220 and the sidewall 211 of the vessel body 210 to a temperature at which evaporation of the liquid precursor is facilitated, but the liquid precursor is not decomposed. The heater 280 may be a radiant and/or resistive heater. In the illustrated embodiment, a resistant wire helically winds the sidewall 211 of the vessel body 210. In another embodiment, the heater 280 may include heater rods or other internal heating mechanisms that are positioned inside the evaporation space 220. In yet another embodiment, the fluidized bed evaporator 200 may include a heater between the distributor plate 240 and the carrier gas inlet 270. In yet another embodiment, the fluidized bed evaporator 200 may use induction, microwave, and/or light to heat the fluidized bed within the evaporation space 220. A skilled artisan will appreciate that a combination of the foregoing or various other types of heaters can be adapted for heating the fluidized bed evaporator 200. Whether the heater heats the walls of the vessel body 210 or more directly heats the fluidized bed, the fluidized bed and thermally conductive granules 215 facilitate efficient distribution of heat to the precursor. The high surface area of the heated precursor facilitates efficient vaporization rates and greater ease of saturation of the carrier gas with vaporized precursor.

FIG. 2A illustrates a state in which the fluidized bed evaporator 200 is ready for operation. The inert granules 215 are supported on the distributor plate 240, and are stationary. FIG. 2B illustrates a state in which the fluidized bed evaporator 200 is in operation. A carrier gas is provided at a high flow rate through the carrier gas inlet 270, and is provided upward through the holes of the distributor plate 240. The carrier gas moves at least some of the inert granules 215 upward, and suspends and stirs them in the evaporation space 220, forming a fluidized bed. The movement of the inert granules 215 above the evaporation space 220 is restricted by the filter 230.

The heater 280 is turned on to heat the sidewall 211 of the vessel body 210 such that the temperature of the granules 215 in the evaporation space 220 is suitable for the evaporation, but not decomposition, of the liquid precursor. A skilled artisan will appreciate that the temperature of the fluidized bed in the evaporation space 220 can vary widely depending on the types of the precursor.

While the inert granules 215 form a fluidized bed, the liquid precursor is provided into the evaporation space 220 through the precursor inlet 250. In certain embodiments, the liquid precursor may be in a form of mist. The liquid precursor contacts the surfaces of the heated inert granules 215, and evaporates into gas. Because the levitated inert granules 215 provide a greater evaporation surface area than when there are no inert granules, or when granules are not levitated, the evaporation of the liquid precursor is facilitated.

In addition, the fluidized bed has good thermal conductance, and efficiently heats the liquid precursor to vaporize into a gaseous state. Granules forming the fluidized bed are moved substantially continuously in substantially all directions. In other words, the granules behave like a fluid. This results in an intense thermal contact between the heated sidewalls 211 of the vessel body 210 and the granules 215. Thus, the fluidized bed has good thermal conductance. Good thermal conductance of the fluidized bed significantly contributes to the evaporation of the precursor. In other embodiments, the fluidized bed can thermally conduct from an internal heater to the granules or can suscept externally generated inductive or microwave energy.

Figure 3:
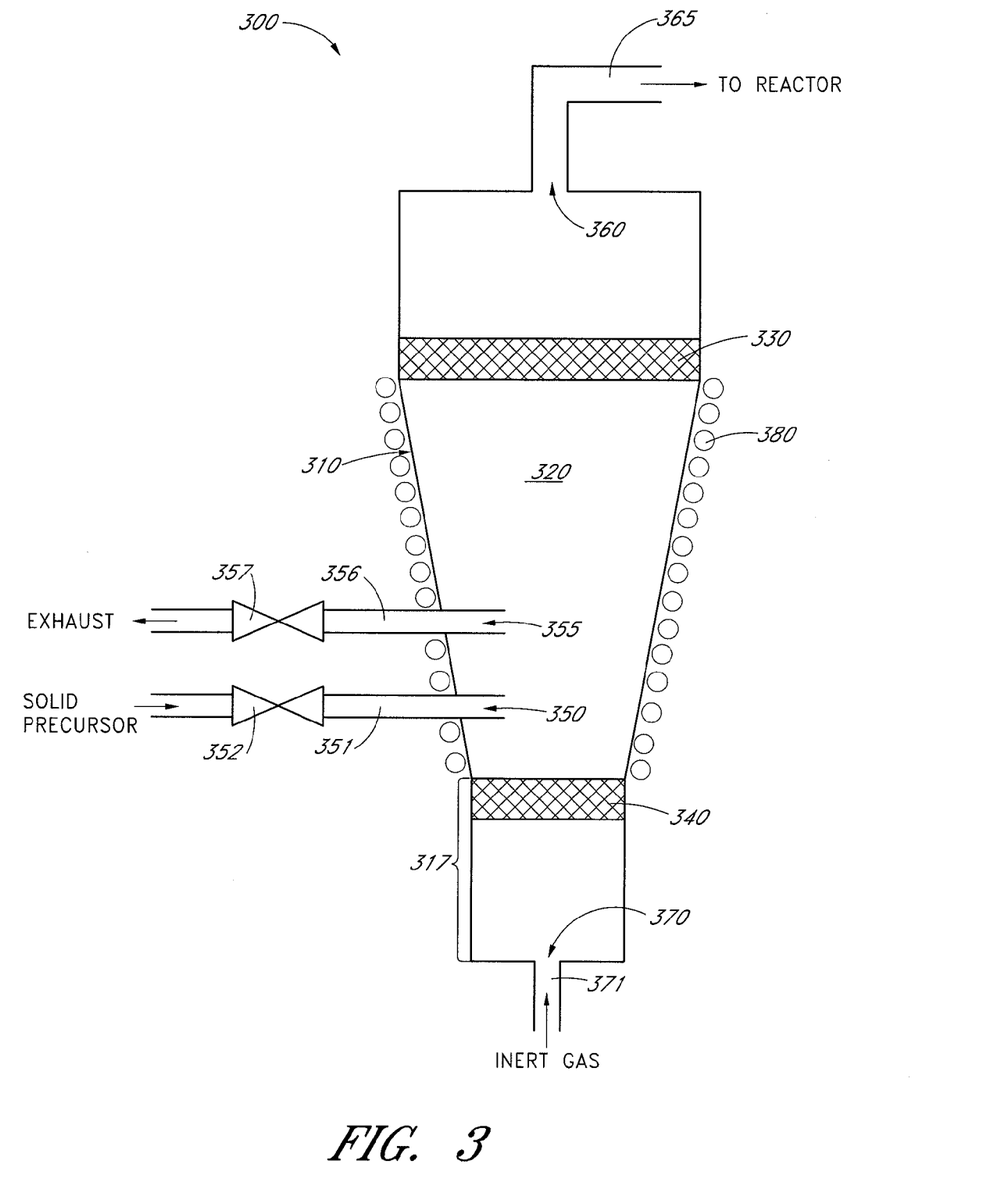
FIG. 3 is a cross-section of another embodiment of a fluidized bed evaporator.

Referring to FIG. 3, another embodiment of a fluidized bed evaporator for a solid precursor will be described below. Examples of solid precursors include, but are not limited to, $ZrCl_4$, $HfCl_4$, and cyclopentadienyl compounds of barium or strontium. Cyclopentadienyl compounds of barium or strontium are described in U.S. Pat. No. 7,108,747, the disclosure of which is incorporated herein by reference. Mixtures of precursors may also be used, provided that the vapor pressures at the temperature of this fluidized bed are closely matched.

The illustrated fluidized bed evaporator 300 includes a vessel body 310, an evaporation space 320, a filter 330, a distributor plate 340, a precursor inlet 350, a solid discharge outlet 355, a precursor gas outlet 360, a carrier gas inlet 370, and a heater 380. The inner walls of the vessel body 310, the filter 330, and the distributor plate 340 together define the evaporation space 320. The configurations of the vessel body 310, the evaporation space 320, the filter 330, the distributor plate 340, the precursor inlet 350, the precursor gas outlet 360, the carrier gas inlet 370, and the heater 380 can be as described above with respect to FIG. 2A, including described alternatives. The fluidized bed evaporator 300 can be connected to a carrier gas line 371 at the carrier gas inlet 370 to receive an inert gas. The fluidized bed evaporator 300 can be connected to a precursor gas line 365 at the precursor gas outlet 360 to provide a precursor in vapor phase to a reactor.

The vessel body 310 serves to produce a fluidized bed in the evaporation space 320 thereof. In one embodiment, the fluidized bed may be formed by solid precursor particles in a form suitable for sublimation in the evaporation space 320. The solid precursor particles may be in a form of powder.

In another embodiment, the fluidized bed is formed by inert granules, such as those described above in connection with FIG. 1. In such an embodiment, solid precursor particles in a form of, for example, powder, may be provided into the evaporation space 320, levitated and stirred among the inert granules in the fluidized bed for sublimation.

In yet another embodiment, the fluidized bed may be formed by inert granules coated with a solid precursor. In such an embodiment, the inert granules coated with the solid precursor are provided into the evaporation space 320 such that the solid precursor is sublimed into a gaseous state. The other details of the vessel body 310 can be as described in connection with FIG. 2A.

The precursor inlet 350 serves as an inlet for a solid precursor in a form of powder or inert granules coated with a solid precursor. The precursor inlet 350 is in fluid communication with a precursor container (not shown) via a precursor inlet line 351. The solid precursor or coated inert granules may be carried by an inert carrier gas. The precursor inlet line 351 can have a valve 352 to control the flow of the precursor.

The solid discharge outlet 355 serves as an outlet for a used or partly used solid precursor and/or inert granules. In an embodiment where a solid powder precursor is provided into the evaporation space 320, when particles of the solid powder precursor decrease in size by sublimation and approach a size of the openings of the filter 330, the solid precursor particles may be discharged through the solid discharge outlet 355 to a discharge line 356. The discharge line 356 can have a valve 357 to control the flow of the used solid precursor. This configuration prevents the solid precursor particles from being supplied to a reactor (not shown) along with a vapor phase precursor. In another embodiment where inert granules coated with a solid precursor are provided into the evaporation space 320, substantially bare inert granules may be discharged through the solid discharge outlet 355 after the coated solid precursor has sublimed into a gaseous state.

Referring still to FIG. 3, one embodiment of a method of operating the fluidized bed evaporator 300 will be described below. As described above, in one embodiment, a fluidized bed may be formed by solid precursor particles in a powder form. In such an embodiment, the solid precursor particles may be provided along with a carrier gas, forming a gas-borne flow of particles into the evaporation space 320. The particles form a fluidized bed while being sublimed into a gaseous state.

As the solid precursor particles stay longer in the evaporation space 320, at least a portion of them sublimes, and the particles become smaller in size, or the thickness of precursor coating over inert granules shrinks. The solid precursor particles or coated granules may be automatically discharged through a filter over the discharge outlet 355 before they become smaller in size than the size of the openings of the filter 330.

In another embodiment, the solid precursor particles may be provided as a batch into the evaporation space 320, and sublimed into the vapor phase. In such an embodiment, the entire portion of the solid precursor particles may be discharged in a batch through an automated or manually-operated door at a lower portion 317 of the fluidized bed evaporator 300 when at least some of the precursor particles reach a certain size.

In yet another embodiment, the fluidized bed evaporator 300 contains a fluidized bed formed by inert granules. A solid precursor in a powder form may be provided as a batch into the evaporation space 320, and sublimed into a gaseous state. The solid precursor may be discharged through the filter in the discharge outlet 355 when it reaches a certain average size or in a batch.

In yet another embodiment, the fluidized bed evaporator 300 is provided with inert granules coated with a solid precursor. Such inert granules coated with the solid precursor can be provided in a batch into the evaporation space 320. Inert granules left after the precursor has sublimed may be recycled, as will be described below.

Referring to FIG. 4A, one embodiment of a fluidized bed system using inert granules coated with a solid precursor will be described below. The illustrated system 400 includes a fluidized bed evaporator 410, a coated granule container 420, a precursor coating apparatus 430, and an inert granule collector 440. The configuration of the fluidized bed evaporator 410 can be as described above with respect to the fluidized bed evaporator 300 of FIG. 3.

The system 400 also includes a first line 451, a second line 452, a third line 453, a fourth line 454, a fifth line 455, a sixth line 456, and a seventh line 457. The first line 451 runs from a first carrier gas source (not shown) into the fluidized bed evaporator 410. The first line 451 may have a first valve 461 and a first mass flow controller (MFC) 471 to control a flow therethrough.

The second line 452 extends from a first connection point of the first line 451 between the first MFC 471 and the first valve 461, and extends to the coated granule container 420. The second line 452 may be provided with a second valve 462.

The third line 453 extends from inside of the coated granule container 420 and connects to a second connection point of the first line 451 between the first valve 461 and the fluidized bed evaporator 410. The third line 453 may be provided with a mass flow meter (MFM) 472 to measure a total amount of the precursor and the carrier gas flowing through the third line 453. The third line 453 may also be provided with a third valve 463.

The fourth line 454 extends from the precursor coating apparatus 430 to the coated granule container 420. The fourth line 454 may be provided with a fourth valve 464. The fifth line 455 extends from inside of the fluidized bed evaporator 410 to the inert granule collector 440. The fifth line 455 may be provided with a fifth valve 465.

The sixth line 456 runs from a second carrier gas source (not shown) to a connection point of the fifth line 455 between the fluidized bed evaporator 410 and the inert granule collector 440. The sixth line 456 may be equipped with a sixth valve 466, and a second mass flow controller 473 to control a flow therethrough. The seventh line 457 runs from the inert granule collector 440 to the precursor coating apparatus 430. The seventh line 457 may be provided with a seventh valve 467.

Referring to FIGS. 4A and 5, the operation of the system 400 will be described below. The coated granule container 420 contains inert granules coated with a solid precursor (hereinafter, "coated granules"). The second and third valves 462, 463 are opened, and the other valves are closed to supply the coated granules to the fluidized bed evaporator 410. A carrier gas, for example, an inert gas, is provided into the coated granule container 420 through the second line 452. The carrier gas entrains and carries the coated granules through the third line 453 and the first line 451 to the evaporator 410. A selected amount of the coated granule may be supplied into the evaporator 410 in this manner (step 510), and then the second valve 462 is closed. During this step, the evaporator 410 is off.

Subsequently, the first and sixth valves 461, 466 are opened to supply the carrier gas into the evaporator 410 while the other valves are closed. The carrier gas moves the coated granules upward in the evaporator 410, thereby forming a fluidized bed. This step is continued until a substantial portion of coated solid on the inert granules has sublimed into a gaseous state (step 520). The sublimed precursor is supplied to the reactor, as described above in connection with FIG. 1.

After a substantial portion of coated solid on the inert granules has sublimed into a gaseous state, depleted inert granules with thin or no precursor coating are discharged to the inert granule collector 440 (step 530), for example, through the fifth line 455 by opening the first and fifth valves 461, 465 and closing the second, fourth, sixth, and seventh valves 462, 464, 466, 467. During this step, the third valve 463 may be opened or closed. The inert granules are collected by the inert granule collector 440 and are supplied to the precursor coating apparatus 430 via the seventh line 457, such as by entraining and carrying the granules in a carrier gas flow. The precursor coating apparatus 430 is configured to coat the inert granules with a solid precursor (step 540), and supplies the coated granules to the coated granule container 420 via the fourth line 454 (step 510). In certain embodiments, the inert granule collector 440 may be omitted. In such embodiments, depleted inert granules may be transferred directly to the precursor coating apparatus 430.

Referring now to FIG. 4B, one embodiment of the precursor coating apparatus 430 of FIG. 4A will be described below. The illustrated coating apparatus 430 includes a fluidized bed condenser 431, a solid precursor container 435, and a carrier gas line 436.

The fluidized bed condenser 431 includes a condenser vessel 432, a condenser filter 433, and a condenser distributor plate 434. The condenser vessel 432 provides a condensation space for condensing a vaporized precursor on depleted inert granules 438 that form a fluidized bed therein. The temperature of the inert granules 438 in the condensation space 432 is maintained below the condensation temperature of a precursor being processed by the condenser 431, and the fluidized bed ensures good heat distribution among the inert granules 438 for maintaining temperatures below the condensation temperature throughout the fluidized bed.

The bare or depleted inert granules 438 are provided into the condenser vessel 432 through the seventh line 457 from the inert granule collector 440 (FIG. 4A). In other embodiments, the inert granules 438 may be provided by another source, not by the inert granule collector 440. The configurations of the condenser filter 433 and the condenser distributor plate 434 can be as described above with respect to the filter 230 and distributor plate 240 of the fluidized bed evaporator 200 of FIG. 2A.

The solid precursor container 435 contains bulk solid precursor 439 therein. The solid precursor container 435 is provided with a carrier gas through the carrier gas line 436, and is configured to provide the carrier gas to the bottom (as shown) or upper space of the condenser vessel 432. The solid precursor container 435 also includes a heater configured to heat the bulk solid precursor 439 such that at least a portion of the bulk solid precursor 439 sublimes into a gaseous state. The carrier gas, while being supplied to the condenser 431, moves the vapor phase precursor into the condenser vessel 432.

During operation, the condenser 431 may receive bare or depleted inert granules 438 in a batch, such as by entraining granules in a carrier gas flow. In the condenser 431, the inert granules 438 are moved upward by the carrier gas, thereby forming a fluidized bed. The vapor phase precursor is supplied from the bottom of the condenser 431 along with the carrier gas.

The vapor phase precursor is condensed on the surfaces of the inert granules 438 because the temperature of the granules 438 in the condensation space is kept below the condensation temperature of the precursor by a temperature control system. During this step, the inert granules are stirred by the high flow of carrier gas. Substantially the entire surface of each inert granule may contact with the vapor phase precursor, and is coated with the precursor. During this step, the fourth line 454 is closed.

Figure 4A:
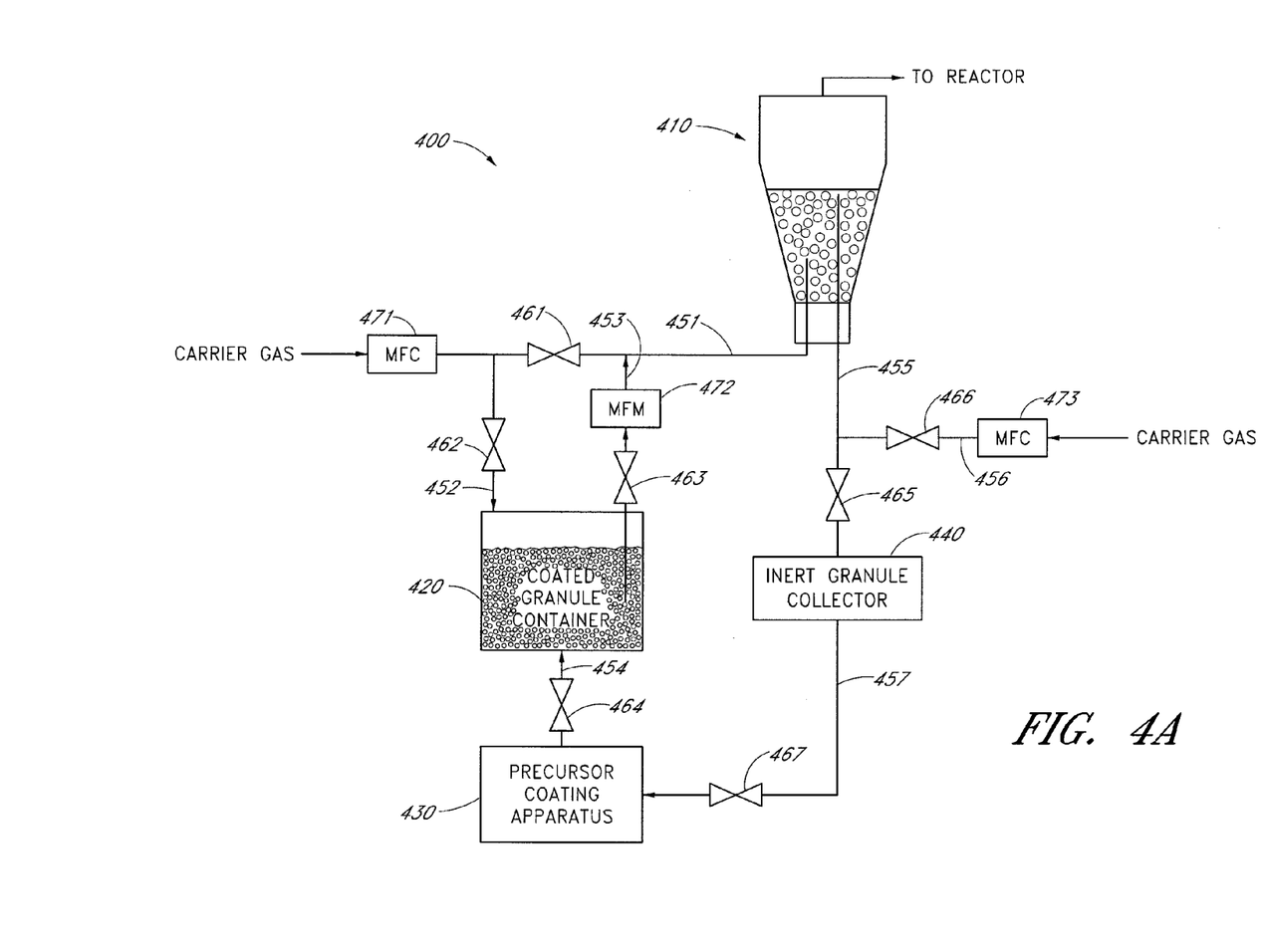
FIG. 4A is a block diagram of one embodiment of a fluidized bed evaporation system using precursor-coated inert granules to form a fluidized bed and an integrated coating apparatus for coating the granules.
Figure 4B:
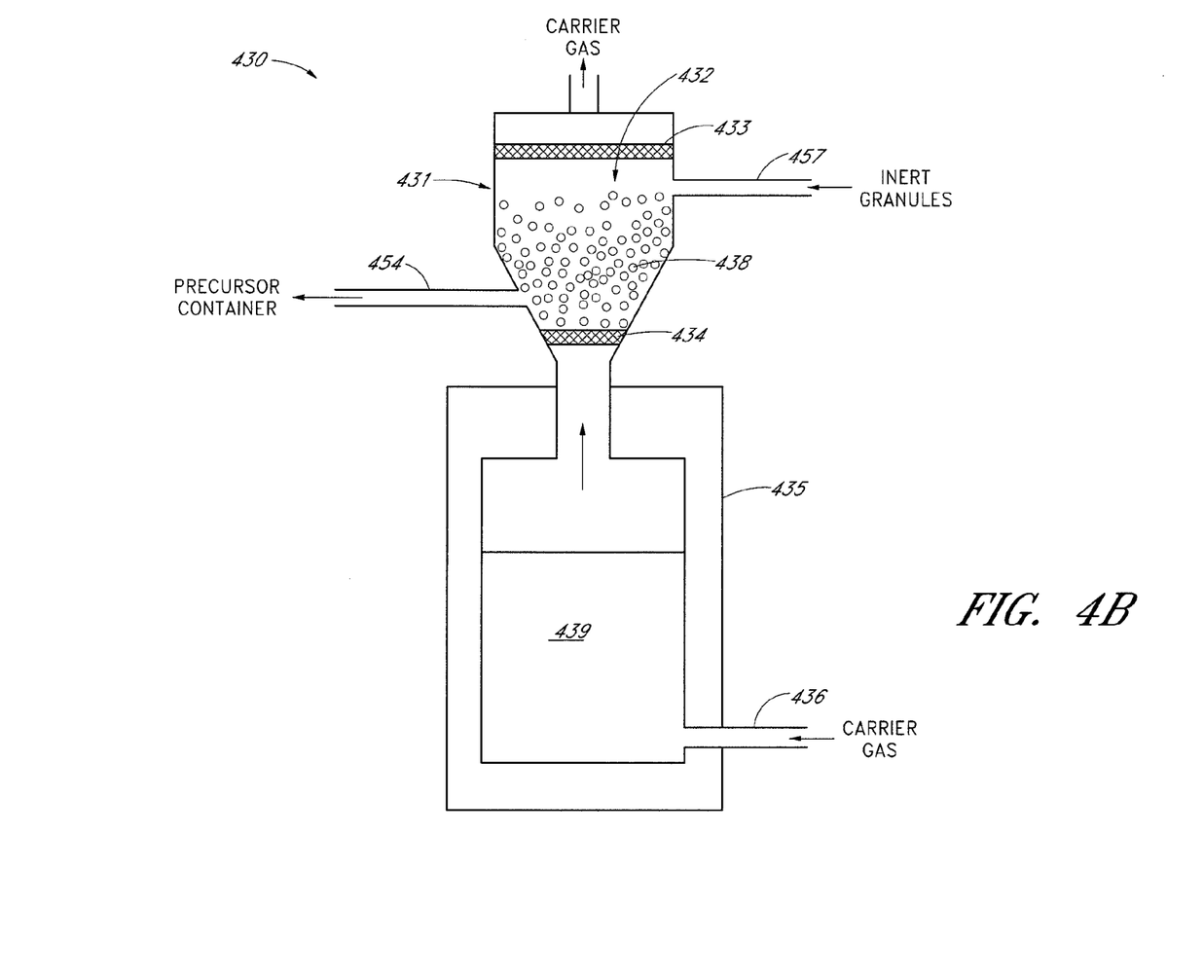
FIG. 4B is a block diagram of an apparatus for coating inert granules with a solid precursor according to one embodiment, for use in an evaporation system such as that of FIG. 4A.
Figure 5:
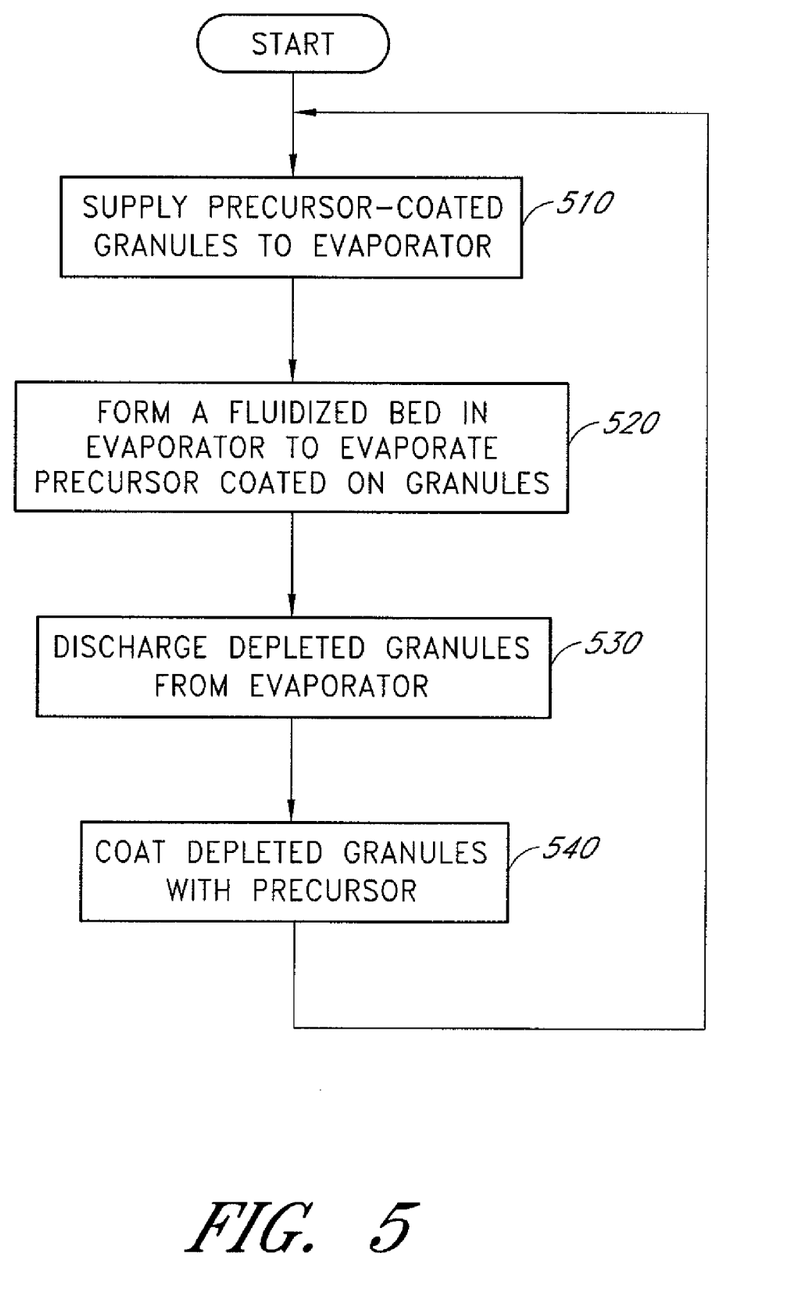
FIG. 5 is a flow chart illustrating a method of automated recharging for an evaporation system, such as that of FIG. 4A.

After the granules are coated with the precursor, they are discharged through the fourth line 454 to the coated granule container 420 (FIG. 4A). The coated granules can be supplied to the fluidized bed evaporator, as described above in connection with FIG. 4A. In another embodiment, the precursor coating apparatus may be a separate apparatus, and the coated granules may be transported to the deposition system in transport containers.

Figure 6:
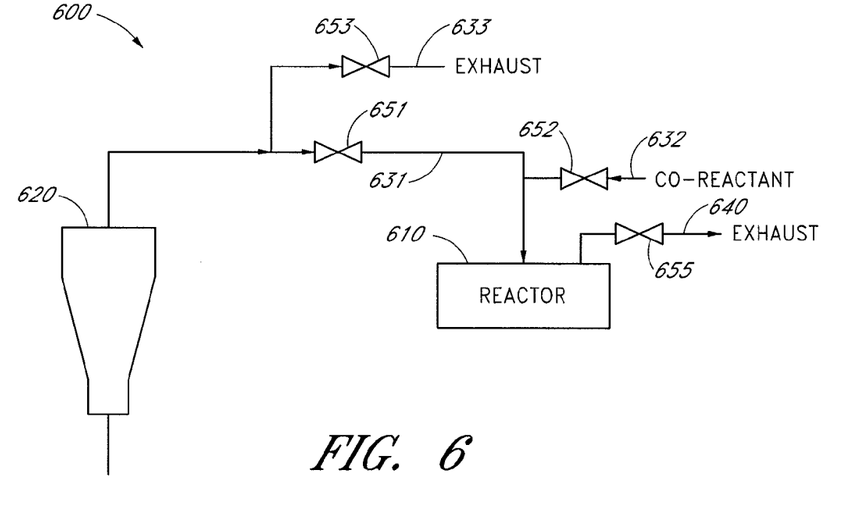
FIG. 6 is a block diagram of another embodiment of a deposition system including a fluidized bed evaporator.

Referring to FIG. 6, another embodiment of a deposition system including a fluidized bed evaporator will be described below. The illustrated system 600 includes a reactor 610, a fluidized bed evaporator 620, first to third gas lines 631, 632, 633, and an outlet line 640. In other embodiments where two or more co-reactants are used, the system can include more lines for providing passages for the co-reactants.

Although not illustrated, the system 600 may also include a controller (for example, a computer) that controls the operation of the system 600, as described herein. A skilled artisan will appreciate that the system can include any other components necessary for the operation of the system 600.

In the embodiments described below, at least some of lines or gas passages are provided with mechanical valves. In other embodiments, at least one of the mechanical valves may be replaced with or combined with so-called "inert gas valving" or "transition valving," which involves controlling the direction of an inert gas flowing through the line and containing a vapor phase precursor. Details of inert gas valving are described in U.S. Pat. No. 6,783,590, the entire disclosure of which is incorporated herein by reference.

The reactor 610 may be a chemical vapor deposition (CVD) reactor for housing one or more substrates (e.g., wafers) on which deposition will take place. A skilled artisan will appreciate that the reactor 610 can be any type of reactor that uses a naturally liquid or solid precursor suitable for evaporation by the fluidized bed evaporator 620.

The fluidized bed evaporator 620 provides a vapor phase precursor to the reactor 610. The details of the evaporator 620 can be one of those described above in connection with FIGS. 2A, 2B, and 3-5.

The first line 631 extends from the fluidized bed evaporator 620 to the reactor 610, providing a passage for the vapor phase precursor. The first line 631 may include a first valve 651 to open, close, or control the flow therethrough.

The second line 632 extends from a second reactant source (not shown), and merges with the first line 631 at a first connection point near the reactor 610. The second line 632 forms a passage for the second reactant. The second line 632 may include a second valve 652 to open, close, or control the flow therethrough.

The third line 633 extends from a second connection point of the first line 631 between the fluidized bed evaporator 620 and the first valve 651. The third line 633 serves as an exhaust passage or vent for the vapor phase precursor. The third line 633 may include a third valve 653 to open, close, or control the flow therethrough.

The outlet line 640 extends from the reactor 610 to an evacuation pump (not shown). The outlet line 640 serves as an exhaust passage for an unused precursor, unused co-reactants, and any by-products produced in the reactor 610 during a process therein. The outlet line 640 may include an exhaust valve 655 to open, close, or control the flow therethrough. The exhaust lines 633, 640 can connect to the same pump or different pumps.

During the operation, the third valve 653 may be opened and the first valve 651 is closed until the fluidized bed evaporator 610 produces a stable flow of a vapor phase precursor. When the fluidized bed evaporator 610 produces a stable flow of a vapor phase precursor, the third valve 653 may be closed. The precursor may be provided into the reactor 610 to perform a CVD process by opening the first valve 651. The precursor may be provided simultaneously or sequentially with co-reactant(s), such as from the second line 632, into the reactor 610 to perform the CVD process. The precursor and co-reactant(s) are in the vapor phase, and are carried by a carrier gas. The first and second valves 651, 652 may be opened simultaneously or sequentially during the process. A skilled artisan will appreciate that the operation of the system 600 can vary widely, depending on the types and numbers of reactants.

Figure 7:
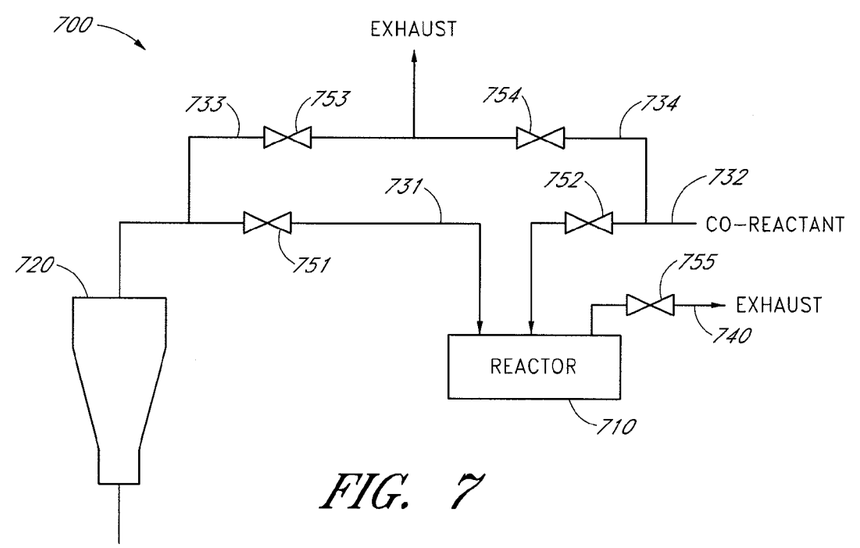
FIG. 7 is a block diagram of yet another embodiment of a deposition system including a fluidized bed evaporator.

Referring to FIG. 7, yet another embodiment of a deposition system including a fluidized bed evaporator will be described below. The illustrated system 700 includes a reactor 710, a fluidized bed evaporator 720, first to fourth lines 731, 732, 733, 734 and an outlet line 740. In other embodiments where two or more additional reactants are used, the system can include more lines for providing passages for the additional reactants.

Although not illustrated, the system 700 may also include a controller (for example, a computer) that controls the operation of the system 700, as described herein. A skilled artisan will appreciate that the system can include any other components necessary for the operation of the system 700.

The reactor 710 may be an atomic layer deposition (ALD) reactor for housing one or more substrates (e.g., wafers) on which deposition will take place. A skilled artisan will appreciate that the reactor 710 can be any type of reactor that uses a naturally liquid or solid precursor suitable for evaporation by the fluidized bed evaporator 720.

The fluidized bed evaporator 720 provides a vapor phase precursor to the reactor 710. The details of the evaporator 720 can be one of those described above in connection with FIGS. 2A, 2B, and 3-5.

The first line 731 extends from the fluidized bed evaporator 720 to the reactor 710, providing a passage for the vapor phase precursor. The first line 731 may include a first valve 751 to open, close, or control the flow therethrough.

The second line 732 extends from another reactant source (not shown) to the reactor 710. The second line 732 forms a passage for the other reactant. The second line 732 may include a second valve 752 to open, close, or control the flow therethrough.

The third line 733 extends from a connection point of the first line 731 between the fluidized bed evaporator 720 and the first valve 751. The third line 733 serves as an exhaust or vent passage for the vapor phase precursor. The third line 733 may include a third valve 753 to open, close, or control the flow therethrough.

The fourth line 734 extends from a connection point of the second line 732 between the co-reactant source and the second valve 752, and merges with the third line 733. The fourth line 734 serves as an exhaust or vent passage for the other reactant. The fourth line 734 may include a fourth valve 754 to open, close, or control the flow therethrough.

The outlet line 740 extends from the reactor 710 to an evacuation pump (not shown). The outlet line 740 serves as an exhaust passage for unused precursor, unused other reactants, purge gas, and any by-products produced in the reactor 710 during a process therein. The outlet line 740 may include an exhaust valve 755 to open, close, or control the flow therethrough.

During the operation, the third valve 753 may be opened and the first valve 751 is closed until the fluidized bed evaporator 710 produces a stable flow of a vapor phase precursor. When the fluidized bed evaporator 710 produces a stable flow of a vapor phase precursor, the third valve 753 may be closed. Similarly, the fourth valve 754 may be opened and the second valve 752 is closed until a stable flow of the other reactant is produced by another fluidized bed evaporator (not shown) for providing the other reactant in gas state from solid. When a stable flow of the other reactant is supplied, the fourth valve 754 may be closed. More typically, the second reactant is a naturally gaseous material.

The precursor and the other reactant may be provided alternately into the reactor 710 to perform an ALD process. The first and second valve 751, 752 are opened alternately during the process while the other valves are closed. During or after the ALD process, the first and second valves 751, 752 may be closed, and the exhaust valve 755 may be opened to purge the reactor 710 with a source of purge gas (not shown). A skilled artisan will appreciate that the operation of the system 700 can vary widely, depending on the types and numbers of reactants.

Figure 8:
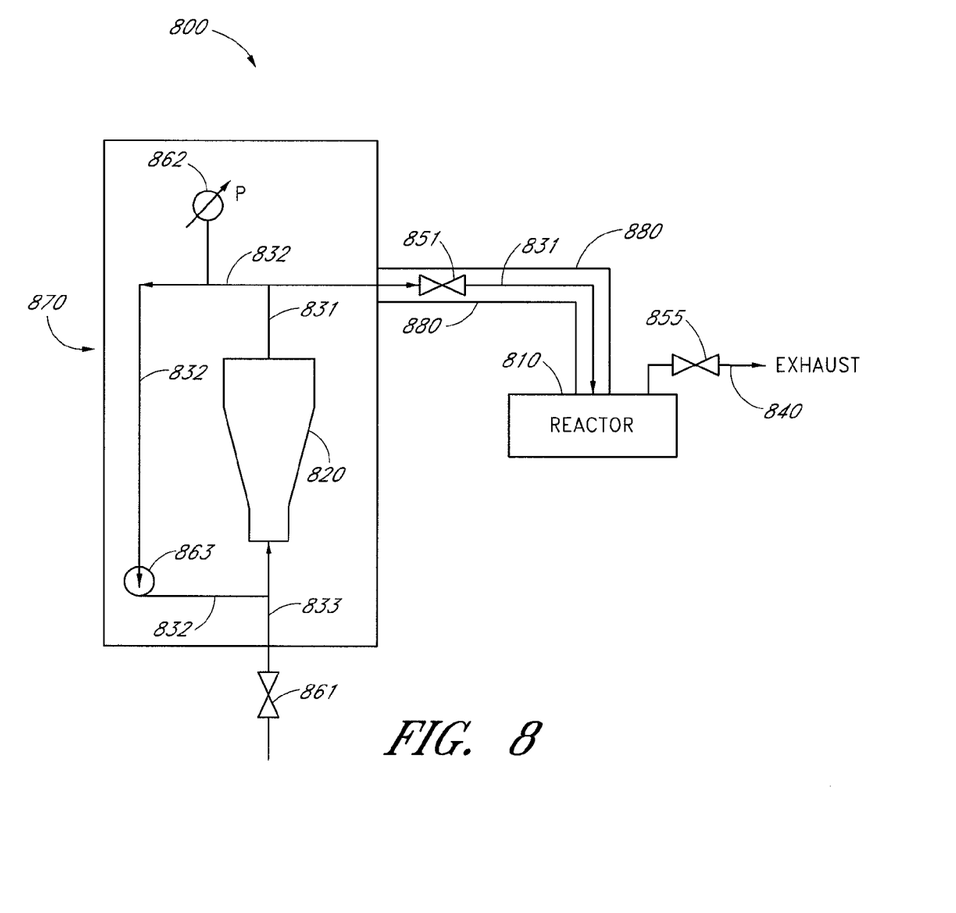
FIG. 8 is a block diagram of yet another embodiment of a deposition system including a fluidized bed evaporator, employing a circulated vaporized precursor path.

Referring to FIG. 8, yet another embodiment of a deposition system including a fluidized bed evaporator will be described below. In contrast to the vented lines of FIGS. 6 and 7, FIG. 8 employs a continuous loop for evaporated precursor, from which vapor can be drawn periodically for use in deposition. The illustrated system 800 includes a reactor 810, a fluidized bed evaporator 820, a first line 831, a second line 832, a third line 833, and an outlet line 840. The system 800 also includes a first heating system 870 and a second heating system 880. In other embodiments where one or more additional reactants are used, the system can include more lines for providing passages for the additional reactants to the reactor 810, as described above in connection with FIGS. 6 and 7.

Although not illustrated, the system 800 may also include a controller (for example, a computer) that controls the operation of the system 800, as described herein. A skilled artisan will appreciate that the system can include any other components necessary for the operation of the system 800.

The reactor 810 may be a chemical vapor deposition (CVD) reactor. In another embodiment, the reactor 810 may be an atomic layer deposition (ALD) reactor. A skilled artisan will appreciate that the reactor 810 can be any type of reactor that uses a naturally liquid or solid precursor suitable for evaporation by the fluidized bed evaporator 820.

The fluidized bed evaporator 820 provides a vapor phase precursor to the reactor 810. The details of the evaporator 820 can be for one of those described above in connection with FIGS. 2A, 2B, and 3-5.

The first line 831 extends from the fluidized bed evaporator 820 to the reactor 810, providing a passage for the evaporated precursor. The first line 831 may include a first valve 851 to open, close, or control the flow therethrough. In addition, the first line 831 may contain restrictions to regulate the flow. In certain embodiments, the restrictions can be provided in conjunction with inert gas valving, as described in the incorporated '590 patent, referenced in the description above of FIG. 6.

The second line 832 extends from a connection point of the first line between the evaporator 820 and the first valve 851, and merges with the third line 833, forming a loop for a vapor phase precursor with the first and third lines 831, 833 and the evaporator 820. At least a portion of the loop may be heated to prevent the evaporated precursor from condensing, schematically indicated by a heating system 870 creating a hot zone for the evaporator 820 and its associated lines 831, 832, 833. The second line 832 may include a pressure meter 862 and a pump 863. The pressure meter 862 is configured to measure the pressure of the precursor flowing through the second line 832. In certain embodiments, the pressure meter 862 may provide a feedback signal to the pump 863. The pump 863 maintains the pressure and flow of the precursor. In certain embodiments, the pump 863 may adjust the pressure and flow of the precursor, based at least partly on the feedback signal from the pressure meter 862.

The third line 833 extends from a carrier gas source (not shown) to the fluidized bed evaporator 820. The third line 833 serves as a passage for the carrier gas and the evaporated precursor circulating the loop. The third line 833 may include a carrier gas valve 861 to open, close, or control the flow therethrough.

The outlet line 840 extends from the reactor 810 to an evacuation pump (not shown). The outlet line 840 serves as an exhaust passage for an unused precursor, unused other reactants, purge gas and any by-products produced in the reactor 810 during a process therein. The outlet line 840 may include an exhaust valve 855 to open, close, or control the flow therethrough.

The first heater 870 may be a heated oven enclosing the continuous loop. The heated oven may include a low pressure box with a reflective interior and radiant heating elements or lamps within the low pressure box. Such a low pressure box prevents heat losses from the solid source vessel. Examples of heated ovens are disclosed in U.S. Pat. No. 6,699,524 and U.S. Patent Application Publication No. 2005/0000428, the entire disclosures of which are incorporated herein by reference. While the incorporated disclosures employ radiant heating, other types of heating can maintain a uniform temperature for the evaporator 820 and related components. The second heater 880 is configured to heat the first line 831 and the first valve 851 and may be implemented, e.g., as blanket heaters. The first and second heaters 870, 880 are configured to prevent condensation of vaporized precursor.

During the operation, the precursor is supplied into the reactor 810 to perform a CVD or ALD process. The first valve 851 is opened periodically during the process when the evaporated precursor is needed. In the illustrated embodiment, during the process, the first valve 851 may be closed when the evaporator 820 does not need the precursor, for example, at purge steps. At such times, the vapor phase precursor produced by the evaporator 820 can circulate the loop, and the evaporator 820 can keep producing the vapor phase precursor. At such steps, the pump is on to maintain the circulation of the precursor in the loop including the evaporator 820. In this manner, the system can provide a sufficient amount of the precursor (sufficiently high partial pressure) for the next step. In some embodiments, the circulation permits saturation of the carrier gas with the precursor. Ideally, all wetted parts (exposed to the vaporized precursor) of the loop with the fluidized bed and the pump are at the same, possibly elevated, temperature. To uniformly elevate the temperature of the loop, the entire loop may be placed in an oven to create a hot zone. The evaporator 820 may be equipped with a precursor inlet and a precursor exhaust similar to the precursor inlet 350 and the solid (or liquid) precursor exhaust 355 as described in connection with FIG. 3.

Switching between provision of the precursor to the reactor and circulation of the precursor may be achieved by so-called "inert gas valving" or "transition valving," which involves controlling the direction of an inert gas flowing through the line, containing the precursor, creating an inert gas barrier. A more detailed description is provided in the incorporated '590 patent referenced in the description above of FIG. 6. An advantage of such an arrangement is that gas flow can be quickly switched without leaving a large volume of precursor in communication with the reactor to diffuse in. At the same time, sensitive valves, prone to breakdown or high contamination when exposed to high temperatures, can be moved outside the hot zone. Pipes can thus be kept free of condensation without sacrificing fast and abrupt switching ability. In other embodiments, the switching may be achieved by a simple valve.

The embodiments described above use various forms of fluidized beds for converting a liquid or solid precursor into gas phase. The fluidized beds have good thermal conductivity and high surface area/volume ratio. Such characteristics permit a relatively small sized evaporator with high flow capability.

Accordingly, it will be appreciated by those skilled in the art that various omissions, additions and modifications can be made to the processes described above without departing from the scope of the invention, and all such modifications and changes are intended to fall within the scope of the invention, as defined by the appended claims.

We claim:

1. A method of depositing a film on a substrate, the method comprising:
   providing one or more substrates in a vapor deposition reactor;
   converting a non-gaseous precursor into vapor phase, wherein converting the precursor comprises:
      forming a fluidized bed by flowing gas at a sufficiently high flow rate to suspend and stir a plurality of solid particles, wherein the fluidized bed is separate from the vapor deposition reactor,
      providing the non-gaseous precursor as a liquid precursor and/or a solid precursor to the fluid bed; and
      vaporizing the non-gaseous precursor in the fluidized bed;
   transferring the precursor in vapor phase from the fluidized bed to the vapor deposition reactor through a passage; and
   performing deposition in the vapor deposition reactor on the one or more substrates with the transferred precursor in vapor phase.

2. The method of claim 1, wherein the solid particles comprise inert solid particles, and wherein the non-gaseous precursor is provided as a liquid precursor to the fluidized bed.

3. The method of claim 1, wherein providing the non-gaseous precursor comprises providing the non-gaseous precursor as a solid precursor, wherein the solid particles comprise inert solid particles and particles of the non-gaseous precursor, and wherein vaporizing the non-gaseous precursor further comprises subliming at least a portion of the particles of the non-gaseous precursor.

4. The method of claim 1, wherein providing the non-gaseous precursor comprises providing the non-gaseous precursor as a solid precursor, wherein the solid particles comprise a plurality of particles of the non-gaseous precursor, and wherein vaporizing the non-gaseous precursor comprises subliming at least a portion of the plurality of particles.

5. The method of claim 1, wherein the solid particles comprise inert granules coated with a solid form of the non-gaseous precursor, and wherein vaporizing the non-gaseous precursor comprises subliming at least a portion of the non-gaseous precursor coated on the inert granules.

6. The method of claim 5, further comprising coating the inert granules with the non-gaseous precursor, wherein coating the inert granules comprises forming a fluidized bed with the inert granules and condensing a vapor of the non-gaseous precursor onto the inert granules.

7. The method of claim 6, further comprising discharging the inert granules after vaporizing the non-gaseous precursor; and reusing the inert granules for vaporizing the non-gaseous precursor after coating the inert granules with the non-gaseous precursor.

8. The method of claim 1, wherein at least a portion of the solid particles comprises the non-gaseous precursor in a solid form, and wherein the method further comprises recharging the solid particles to form the fluidized bed.

9. The method of claim 8, wherein recharging the solid particles comprises entraining and carrying the solid particles with a gas.

10. The method of claim 1, wherein performing the deposition comprises performing chemical vapor deposition or atomic layer deposition.

11. The method of claim 1, further comprising circulating the precursor in the gas phase in a loop formed partly by the fluidized bed before performing the deposition.

12. The method of claim 1, wherein the non-gaseous precursor comprises a mixture of two or more precursors with substantially equal vapor pressures.

* * * * *